United States Patent [19]

Itabashi

[11] Patent Number: 5,612,247
[45] Date of Patent: Mar. 18, 1997

[54] METHOD FOR FABRICATING ISOLATION REGION FOR A SEMICONDUCTOR DEVICE

[75] Inventor: Kazuo Itabashi, Kawasaki, Japan

[73] Assignee: Fujitsu Limited, Japan

[21] Appl. No.: 503,823

[22] Filed: Jul. 18, 1995

[30] Foreign Application Priority Data

Sep. 22, 1994 [JP] Japan .................................. 6-228402

[51] Int. Cl.$^6$ .................................................. H01L 21/76
[52] U.S. Cl. ............................................ 437/69; 437/70
[58] Field of Search ................. 437/69, 70; 148/DIG. 85, 148/DIG. 86, DIG. 117

[56] References Cited

U.S. PATENT DOCUMENTS

| | | |
|---|---|---|
| 4,564,394 | 1/1986 | Bussman . |
| 5,118,641 | 6/1992 | Roberts . |
| 5,254,494 | 10/1993 | van der Plas et al. . |
| 5,358,893 | 10/1994 | Yang et al. . |
| 5,422,300 | 6/1995 | Pfiester et al. . |
| 5,453,397 | 9/1995 | Ema et al. . |

FOREIGN PATENT DOCUMENTS

| | | |
|---|---|---|
| 0589124A1 | 3/1994 | European Pat. Off. . |
| 4230034 | 8/1992 | Japan . |

OTHER PUBLICATIONS

J. R. Pfiester et al, "Nitride–Clad LOCOS Isolation for 0.25 μm CMOS", 1993 Symposium on VLSI Technology digest of technical papers, pp. 139–140.

*Primary Examiner*—George Fourson
*Attorney, Agent, or Firm*—Staas & Halsey

[57] ABSTRACT

The method for fabricating a semiconductor device comprising the steps of: forming a first oxide film 12 on a surface of a semiconductor substrate 10 and forming a first nitride film 14 on a surface of the first oxide film 12, the first nitride film 14 having a predetermined pattern; isotropically etching the first oxide film 12, with the first nitride film 14 as a mask, to partially expose the surface of the semiconductor substrate 10 and form a hollow 16 just under an end portion of the first nitride film 14; forming a second oxide film 18, thinner than the first oxide film 12, at least on the surface of the semiconductor substrate 10 exposed at the outside of the first nitride film 14 and on a inner surface of the hollow 16; depositing a second silicon nitride film 20 on at least the second oxide film 18, the second silicon nitride film 20 being more liable to oxidation than the first silicon nitride film 14; and oxidizing a region where the first silicon nitride film 14 is absent, with the first silicon nitride film 14 as a mask, to form a device isolation film 24. The second silicon nitride film 20 is formed of a silicon nitride film which is more liable to oxidation, so that when the device isolation film 24 is formed by oxidizing away the second silicon nitride film 20, thickness disuniformity can be decreased.

19 Claims, 11 Drawing Sheets

METHOD FOR FABRICATING ISOLATION REGION FOR A SEMICONDUCTOR DEVICE

BACKGROUND OF THE INVENTION

The present invention relates to a method for fabricating a semiconductor device, specifically a device isolation method for CMOS devices.

To form device isolation films on LSIs, etc., LOCOS (LOCal Oxidation of Silicon) has been conventionally used because of its simple fabrication process. In a method for forming a device isolation film by LOCOS, first a base substrate is oxidized to form a pad oxide film, and a silicon nitride film which is to be an oxidation mask is formed on the pad oxide film. Then, patterning is conducted by lithography and etching so that the silicon nitride film is left only on a device region. When the substrate is oxidized, the oxidation reaction takes place in the region where the silicon nitride film is not remained, and that does not take place in the region where the silicon nitride film is remained. Thus, the device isolation film is selectively formed.

But in the LOCOS method, oxygen is diffused below the silicon nitride film through the edge of the patterned silicon nitride film, and the so-called bird's beak is formed. Consequently, the device isolation film intrudes into the device region, which is a detrimental factor for miniaturization of the device. Accordingly, it is preferred for miniaturization of the device to make the birds'beak lengths as short as possible.

A bird's beak length is very dependent on processing conditions, mainly: a thickness of the pad oxide film, a thickness of the silicon nitride film, a thickness of the device isolation film, etc. The bird's beak has a role of lessening stresses in the silicon substrate due to the oxidation. Generally, the bird's beak length as increases, stresses in the silicon substrate are reduced.

To reduce the bird's beak length, it is effective to thin the pad oxide film and thicken the silicon nitride film. But when the pad oxide film is extremely thin, a sufficient selective ratio of the silicon nitride film to the pad oxide film cannot be obtained in patterning the silicon nitride film. As a result, damages are made in the silicon substrate by the etching, and sometimes large junction leaks occur due to metal contamination of the etching apparatus, etc., which causes, e.g., the problem of defective refresh of DRAMs.

To reduce these problems, some improved LOCOS's have been proposed. One of them is Nitride-Clad LOCOS (hereinafter called NCL: Nitride-Clad LOCOS) proposed at the Symposium on VLSI Technology (J.R.Pfiester et al., "Nitride-Clad LOCOS Isolation for 0.25 μm CMOS", 1993 SYMPOSIUM ON VLSI TECHNOLOGY digest of technical papers, pp.139–140.) FIG. 9 shows the fabrication method of the typical NCL.

First, a silicon substrate 10 is oxidized to form a first oxide film 12. Subsequently, a first silicon nitride film 14 is deposited and patterned (FIG. 9A). The first oxide film 12 is removed by wet etching, and next, a second oxide film 18 which is thinner than the first oxide film 12 is formed. Then, a second silicon nitride film 20 is deposited (FIG. 9B). In this state, oxidation is conducted to form a device isolation film 24 (FIG. 9C). Finally, the first silicon nitride film 14, the second silicon nitride film 20, the first oxide film 12 and the second oxide film 18 are removed (FIG. 9D). Thus a device isolation film having short bird's beaks and being substantially free from defects can be formed by NCL.

As a well forming technique used in fabrication of CMOS devices, the self-aligned twin well technique is well known (see FIG. 10).

First, a pad oxide film 32 is formed on a silicon substrate 10, and a silicon nitride film 34 which is to be an oxidation mask is deposited on the pad oxide film 32. Subsequently, the silicon nitride film 34 is patterned by lithography and etching to remove that portion of the silicon nitride film that is on a region for an n-well to be formed in.

Following the patterning of the silicon nitride film 34, an n-type impurity is implanted through the pad oxide film as a resist 36 and the silicon nitride film 34 as a mask (FIG. 10A).

After the resist 36 is removed, oxidation is conducted with the silicon nitride film 34 as a mask to selectively form a thick oxide film 38. Concurrently therewith, the n-type impurity is diffused in the substrate (FIG. 10B).

Then, after the silicon nitride film 34 is removed, a p-type impurity is implanted (FIG. 10C). At this time the p-type impurity is not implanted in the region where the n-type impurity is implanted, because of the thick oxide film 38 formed thereon. Then, a long-time high-temperature heat treatment is conducted for drive-in diffusion, and then the thick oxide film is removed. Thus, twin wells of an n-well 40 and a p-well 42 for a CMOS device are formed (FIG. 10D).

After the twin wells are thus formed, the device isolation films are formed by LOCOS.

Another twin well forming method is shown in FIG. 11.

A pad oxide film 32 is formed on a silicon substrate 10. A silicon nitride film 34 which is to be an oxidation mask is formed on the pad oxide film 32. Next, the silicon nitride film 34 is patterned by lithography and etching, and that portion of the silicon nitride film 34 that is on device isolation regions is removed (FIG. 11A).

After the resist is removed, a resist 36 is patterned by lithography, and an n-type impurity is implanted in a region for an n-well to be formed in (FIG. 11B).

Following removal of the resist 36, a resist 48 is patterned by lithography, and a p-type impurity is implanted in a region for a p-well to be formed in (FIG. 11C).

After the resist 48 is removed, a long, high-temperature heat treatment is conducted for drive-in diffusion while the implanted n-type impurity and p-type impurity are activated to form the n-well 40 and the p-well 42 (FIG. 11D).

Then, with the silicon nitride film 34, which was first patterned as a mask, oxidation is conducted to form the device isolation films.

But in the method for fabricating a semiconductor device in which the device isolation film is formed by conventional NCL, the oxidation is conducted through the second silicon nitride film, which is hard to oxidize, to form the device isolation film. Accordingly, high-temperature oxidation is necessary, and the oxide film thickness is not uniform. These are problems.

In the method for fabricating a semiconductor device wherein the device isolation film is formed by NCL, when the twin wells are formed by the self-alignment twin well technique, a global step 50 is formed in the boundary between the wells (FIG. 10D). Especially in miniaturized devices which require NCL, the lithography for the patterning has a small depth of focus (DOF), which makes formation of miniaturized patterns difficult. This is a problem.

Another problem is that halation is caused by the step in the boundary between the wells, and the pattern is deformed.

In the conventional semiconductor fabricating method in which twin wells are formed after a device isolation region has been patterned, when NCL is used to form the device isolation film, because of a thick first silicon nitride film of about 140 nm, the concentration of the impurity (which is implanted into the silicon substrate by well ion implantation at energies up to a maximum energy of about 180 keV provided by a common ion implanter) is varied with the film thickness of the first silicon nitride film. Consequently, transistor characteristics, especially a threshold voltage of the p-channel transistor, varies. This is also a problem.

SUMMARY OF THE INVENTION

An object of the present invention is to provide a method for fabricating a semiconductor device which can stably form the device isolation film and which is compatible with CMOS processes.

The above-described object is achieved by a method for fabricating a semiconductor device comprising the steps of: forming a first oxide film on a surface of a semiconductor substrate and forming a first nitride film on a surface of the first oxide film, the first nitride film having a predetermined pattern; isotropically etching the first oxide film, with the first nitride film as a mask, to partially expose the surface of the semiconductor substrate and form a hollow just under an end portion of the first nitride film; forming a second oxide film, thinner than the first oxide film, at least on the surface of the semiconductor substrate exposed at the outside of the first nitride film and on a inner surface of the hollow; depositing a second silicon nitride film on at least the second oxide film, the second silicon nitride film being more liable to oxidation than the first silicon nitride film; and oxidizing a region where the first silicon nitride film is absent, with the first silicon nitride film as a mask, to form a device isolation film.

The above-described object is also achieved by a method for fabricating a semiconductor device comprising the steps of: forming a first oxide film on a surface of a semiconductor substrate and forming a first nitride film on a surface of the first oxide film, the first nitride film having a predetermined pattern; isotropically etching the first oxide film, with the first nitride film as a mask, to partially expose the surface of the semiconductor substrate and form a hollow just under an end portion of the first nitride film; forming a second oxide film, thinner than the first oxide film, at least on the surface of the semiconductor substrate exposed at the outside of the first nitride film and on a inner surface of the hollow; depositing a second silicon nitride film on at least the second oxide film; removing that portion of the second silicon nitride film that is deposited on a region for a device isolation film to be formed in; and oxidizing a region where the first silicon nitride film is absent, with the first silicon nitride film as a mask, to form the device isolation film.

In the above-described method for fabricating a semiconductor device, it is preferable that the first oxide film has a film thickness of below about 20 nm; and the first silicon nitride film has a film thickness of below about 130 nm.

In the above-described method for fabricating a semiconductor device, it is preferable that the first silicon nitride film is deposited by chemical vapor deposition using $SiH_2Cl_2$ gas as a silicon source; and, the second silicon nitride film is deposited by chemical vapor deposition using $SiHCl_3$ gas as a silicon source.

In the above-described method for fabricating a semiconductor device, it is preferable that the second silicon nitride film is deposited at a higher temperature than a temperature for the deposition of the first silicon nitride film.

In the above-described method for fabricating a semiconductor device, it is preferable that the first silicon nitride film is deposited at a film forming temperature lower than 750° C.; and the second silicon nitride film is deposited at a film forming temperature higher than 750° C.

In the above-described method for fabricating a semiconductor device, it is preferable that the device isolation film is formed by thermal oxidation at a temperature above 950° C.

In the above-described method for fabricating a semiconductor device, it is preferable that the step of forming the device isolation film includes a rapid thermal oxidation which can occur at a high temperature and in a short period of time.

In the method for fabricating a semiconductor device according to the present invention, in which the first oxide film is formed on a semiconductor substrate and is isotropically etched off with the first silicon nitride film having a required pattern, and in which the second oxide film and the second silicon nitride film are then deposited, and further in which the device isolation film is formed by thermal oxidation in a region where the first silicon nitride film is absent, the second silicon nitride film is formed of a silicon nitride film which is more liable to oxidation, so that when the device isolation film is formed by oxidizing away the second silicon nitride film, thickness disuniformity can be decreased.

In the above-described method for fabricating a semiconductor, the second silicon nitride film is deposited, and is etched to remove that portion of the second nitride film that is in a device isolation film forming region, so that the device isolation film can be more easily formed by conventional NCL, and thickness disuniformity can be reduced.

In the above-described method for fabricating a semiconductor, a thickness of the first oxide film and a thickness of the first silicon oxide film are set below about 20 nm and below about 130 nm, respectively, so that the concentration variation of an impurity doped in the silicon substrate through these insulating films when the well is formed can be reduced thus reducing thickness disuniformity of the oxide and the nitride films. Variation of transistor characteristics can be prevented.

The first silicon nitride film is deposited by chemical vapor deposition using $SiH_2Cl_2$ gas as a silicon source, and second silicon nitride film is deposited by chemical vapor deposition using $SiHCl_3$ gas as a silicon source, whereby the second silicon nitride film is more liable to oxidation than the first silicon nitride film.

The second silicon nitride film is deposited in the second silicon nitride film depositing step at a temperature lower than that for deposition of the first silicon nitride film, whereby the second silicon nitride film is more liable to oxidation than the first silicon nitride film.

The first silicon nitride film is deposited at a film forming temperature lower than 750° C., and the second silicon nitride film is deposited at a film forming temperature higher than 750° C., whereby the second silicon nitride film can be more liable to oxidation than the first silicon nitride film.

The device isolation film is formed by thermal oxidation at a temperature of above 950° C., whereby the oxidation can be conducted by oxidizing away the second silicon nitride film without thickness disuniformity in the device isolation film.

The use of rapid thermal oxidation in the initial process for formation of the device isolation film facilitates the oxidation at a high temperature, whereby the second nitride film, which is hard to oxidize, can be easily oxidized away.

DETAILED DESCRIPTION OF THE INVENTION

The method for fabricating the semiconductor device according to a first embodiment of the present invention will be explained with reference to FIGS. 1A to 6C.

FIGS. 1A–1D and 2A–2C show sectional views of a semiconductor device in the steps of the method for fabricating the semiconductor device according to the present embodiment for explanation of the method. FIGS. 3A–3D and 4A–4C show sectional views of the semiconductor device in the steps of a first variation of the method for fabricating the semiconductor device according to the present embodiment for explanation of the method. FIGS. 5A–5D and 6A–6C show sectional views of the semiconductor device in the steps of a second variation of the method for fabricating the semiconductor device according to the present embodiment for explanation of the method.

The method for fabricating a semiconductor device shown in FIGS. 1A–1D and 2A–2C will be explained.

Figure 1A:
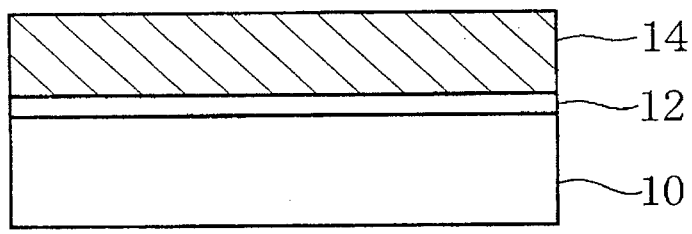
FIGS. 1A–1D and 2A–2C are sectional views of a semiconductor device in the steps of the method for fabricating a semiconductor device according to a first embodiment of the present invention for explanation of the method.

First, a (100) oriented p-type silicon substrate 10 having a resistivity of about 10 Ω-cm is oxidized in a dry atmosphere of 950° C., and a first oxide film 12 about 15 nm-thick is formed. Then a first silicon nitride film 14 about 100 nm-thick is deposited on the first oxide film 12 by low-pressure CVD. The source gas used is dichlorosilane ($SiH_2Cl_2$), and a substrate temperature is 725° C. (FIG. 1A).

Figure 1B:
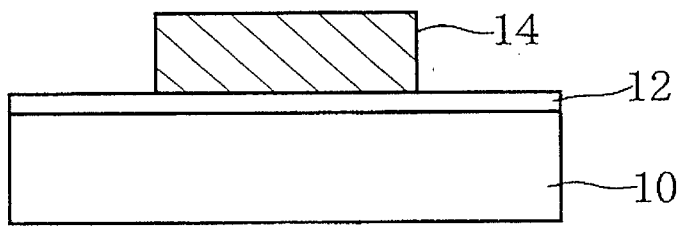

Then a resist is patterned by lithography, and that portion of the first silicon nitride film 14 that is in regions for a device isolation film to be formed in is removed by reactive ion etching (RIE) using $CHF_3$ gas. In the present embodiment, because the patterning for forming the device isolation film is performed before the formation of wells, the surface of the silicon substrate 10 is free from global steps, which enables intra-surface homogeneous patterning, even in semiconductor devices with fine device isolation patterns (FIG. 1B).

Figure 1C:
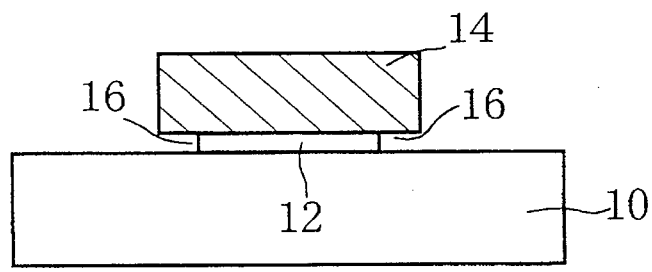

Following the removal of the resist, with the patterned first silicon nitride film 14 as a mask, the first oxide film 12 is removed by wet etching using an aqueous solution of hydrogen fluoride. At this time, the aqueous solution of hydrogen fluoride intrudes into the underside of the first silicon nitride film 14 and etches the first oxide film 12, and a side edge hollow 16 is formed (FIG. 1C).

Figure 1D:
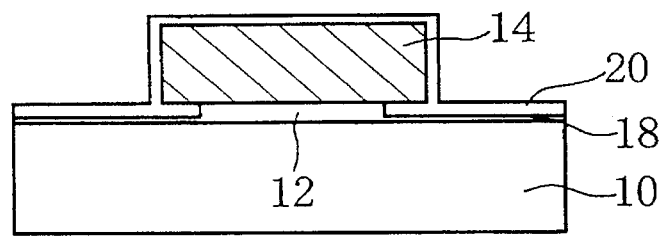

Next, oxidation is conducted in a dry atmosphere of 800° C. to form a second oxide film 18 about 5 nm-thick. Subsequently a second silicon nitride film 20 about 10 nm-thick is deposited on the second oxide film 18 by low-pressure CVD. The source gas used is trichlorosilane ($SiHCl_3$), and a substrate temperature is 775° C. The second silicon nitride film formed at a substrate temperature above 750° C. is more coarse than a silicon nitride film formed at a temperature below 750° C. using $SiH_2Cl_2$, e.g., the first silicon nitride film (FIG. 1D).

Then a resist is patterned by lithography, and ions are implanted in a region for a well to be formed in. When the region is for a p-well, a dose of about $1\times10^{13}$ ions $cm^{-2}$ of boron (B) ions, for example, is implanted at 180 keV energy. When the region is for an n-well, a dose of about $1\times10^{13}$ ions $cm^{-2}$ of phosphorus (P) ions, for example, is implanted at 180 keV energy.

An impurity implanted in the device isolation region is doped into the silicon substrate 10 through the first oxide film 12, the first silicon nitride film 14 and the second silicon nitride film 20. The first oxide film 12 and the first silicon nitride film 14 are 15 nm-thick and a 100 nm-thick respectively, which are thinner than those formed by conventional NCL, so that the impurity to be doped into the silicon substrate 10 through these insulation films will have little concentration disuniformity, thus reducing thickness disuniformity of the oxide film and the nitride film. To suppress variation of a threshold voltage, etc., of the transistor which is caused by concentration disuniformity of the impurity, it is preferred that the first oxide film has a thickness of below 20 nm, and that the first silicon nitride film has a thickness of below 130 nm.

Figure 2A:
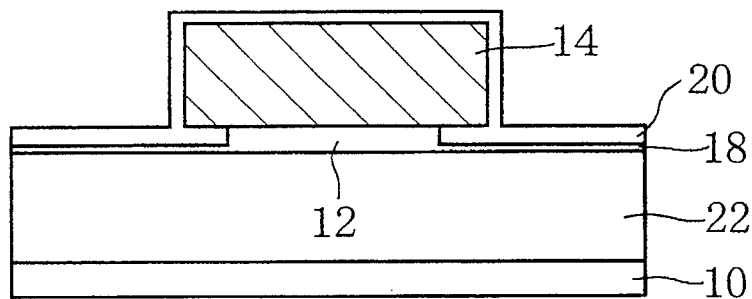

After the resist is removed, heat treatment is performed in an atmosphere of nitrogen at 1200° C. for 90 minutes to drive in the implanted impurity. And the well 22 is formed (FIG. 2A).

Figure 2B:
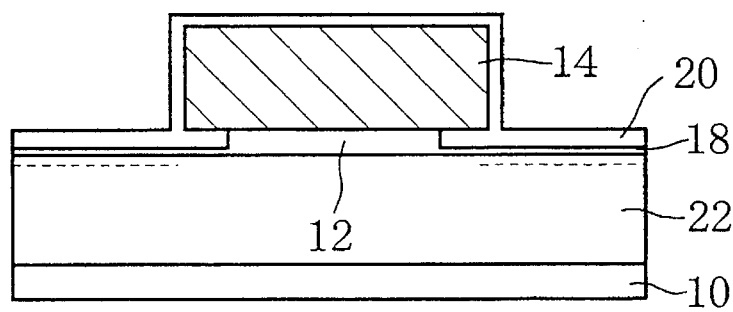

Then a resist is patterned so that the formed p-well region is exposed, and with the resist as a mask, ion implantation is performed. For example, a dose of about $4\times10^{13}$ B ions $cm^{-2}$ is implanted at 20 keV. This implanted impurity is the so-called channel stop impurity (FIG. 2B).

Figure 2C:
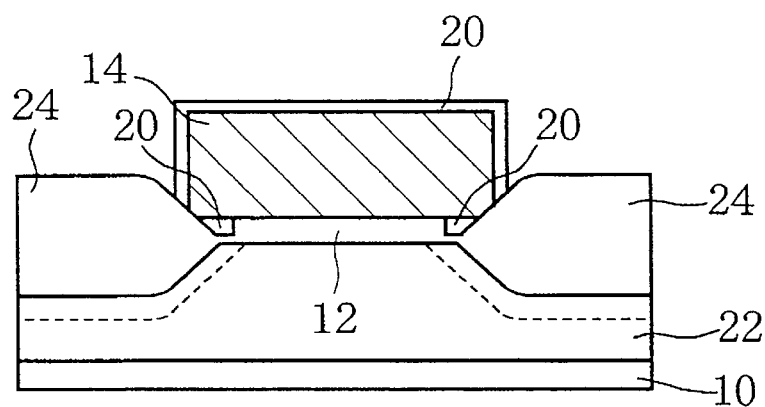

After the resist is removed, oxidation is performed at 1000° C. in a wet atmosphere. At this time, the second silicon nitride film 20, which is coarse, permits the oxidation to advance because of its oxidation resistance. On the other hand the first silicon nitride film functions as the oxidation mask. Thus the device isolation film 24 can be selectively grown (FIG. 2C). In formation of the device isolation film 24 by conventional NCL, the second silicon nitride film, which is hard to oxidize, covers the second silicon oxide film 18, with the result that thickness disuniformity of the second silicon nitride film 20 in forming the device isolation film 24 affects the thickness of the device isolation film 24. But the present embodiment, in which the second silicon nitride film 20 is coarse to be easily oxidized, can suppress thickness disuniformity of the device isolation film 24 more than conventional NCL.

It is preferred that the second silicon nitride film 20, which is coarse and has low oxidation resistance, is formed at a substrate temperature of above 750° C. by the use of $SiHCl_3$ as a source gas for its formation. To form the device isolation film 24 by oxidizing away the second nitride film 20, it is preferred to set the oxidation temperature at above 950° C. because the second silicon nitride film 20 has low oxidation resistance but is hard to oxidize.

The second silicon nitride film, which is a coarse silicon nitride film, fills the side edge hollow 16 generated when the first oxide film 12 was removed, whereby the side edge hollow 16 is oxidized at a lower oxidation rate, and the above-described advantageous effects can be obtained while a sharp bird's beak profile is maintained.

Thus, according to the present embodiment in which the second silicon nitride film is a silicon nitride film, which can be oxidized more easily than the first silicon nitride film, in forming the device isolation film by oxidizing away the second silicon nitride film, film thickness disuniformity can be reduced in comparison with the method for fabricating a semiconductor by NCL.

By setting a thickness of the first oxide film at below about 20 nm, and of the first silicon nitride film below about 130 nm, an impurity to be doped in the silicon substrate through these insulating films when the well is formed may have little concentration disuniformity. Accordingly, variation in transistor characteristics can be prevented.

In the present embodiment, the oxidation is conducted at a temperature of above 950° C. in a wet atmosphere to form the device isolation film, but rapid thermal oxidation (RTO) may be conducted in the initial process of the oxidation of the second nitride film. This is because the use of RTO at the initial process of field oxidation facilitates the oxidation at high temperatures and is effective to oxidize the second nitride film, which is hard to oxidize. In the fabrication process, the usual oxidation follows the second nitride film oxidation by RTO.

In the present embodiment, the ion implanting step for forming the well and the drive-in diffusion step are conducted after the formation of the second silicon nitride film, but may follow the patterning of the first silicon nitride film as shown in the sectional views of FIGS. 3A–3D and 4A–4C.

Figure 3A:
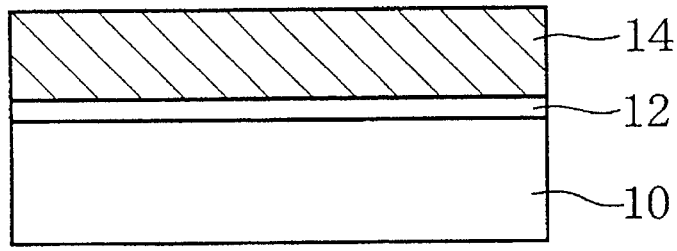
FIGS. 3A–3D and 4A–4C are sectional views of a semiconductor device in the steps of a first variation of the method for fabricating a semiconductor device according to the first embodiment of the present invention for explanation of the method.

To this end, a first (100) oriented p-type silicon substrate 10 having a resistivity of about 10 Ω-cm is oxidized in a dry atmosphere at 950° C. to form the first oxide film 12 about 15 nm-thick. Next, the first silicon nitride film 14 about 100 nm-thick is formed on the first oxide film 12 by low-pressure CVD (FIG. 3A).

Figure 3B:
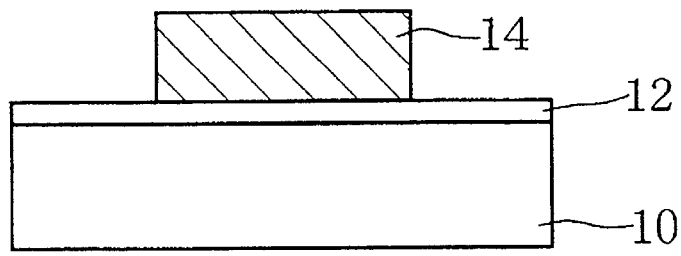

Then, the resist is patterned by lithography to remove that portion of the first silicon nitride film 14 that is in the region for the device isolation film to be formed in, by RIE using $CHF_3$ gas (FIG. 3B).

Next, the resist is patterned by lithography, and ions are implanted in a region for the well to be formed in. When the region is for a k-well, a dose of about $1\times10^{13}$ B ions $cm^{-2}$ for example is implanted at 180 keV and a dose of about $1\times10^{13}$ P ions $cm^{-2}$ for example, is implanted at 180 keV when the region is for an n-well.

Figure 3C:
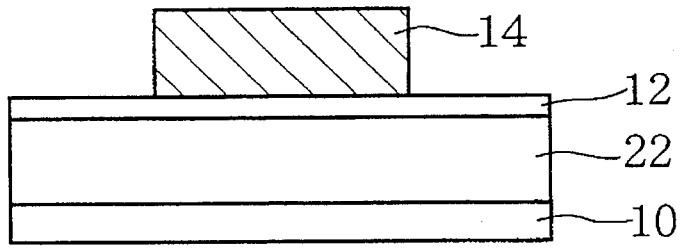

After the resist is removed, heat treatment is conducted at 1200° C. for 90 minutes in a nitrogen atmosphere to drive in the implanted impurity. Thus, the well 22 is formed (FIG. 3C).

Figure 3D:
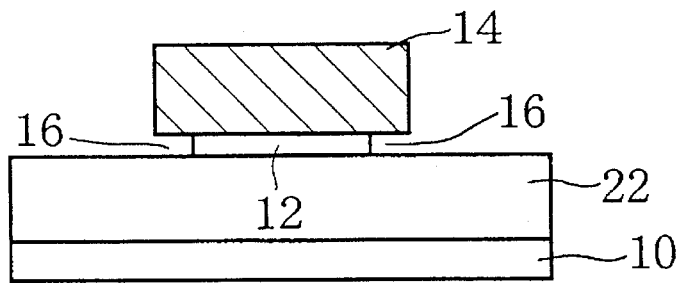

After the resist is removed, the first oxide film 12 is removed with the patterned first silicon nitride film 14 as a mask by wet etching using an aqueous solution of hydrogen fluoride. At this time the aqueous solution of hydrogen fluoride intrudes into the underside of the first silicon nitride film 14 to etch the first oxide film 12, and a side edge hollow 16 is formed (FIG. 3D).

Figure 4A:
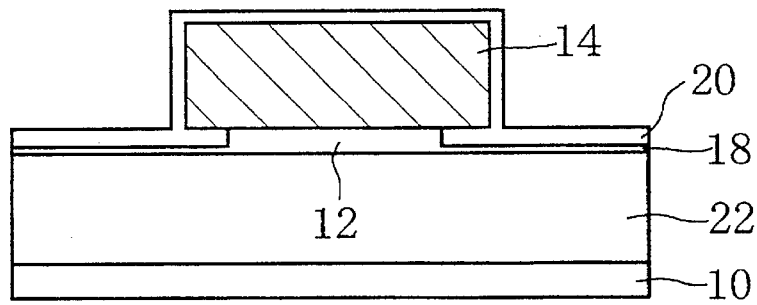

Then, oxidation is performed at 800° C. in a dry atmosphere to form the second oxide film 18 about 5 nm-thick. Subsequently, the second silicon nitride film 20 about 10 nm-thick is deposited on the second oxide film 18 by low-pressure CVD. (FIG. 4A).

Figure 4B:
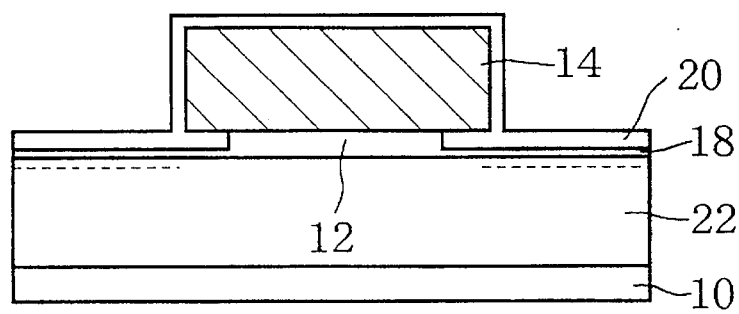

Then, the resist is patterned so that the formed p-well region is exposed. Ion implantation is conducted with the resist as a mask. A dose of about $4\times10^{13}$ B ions $cm^{-2}$, for example, is implanted at 20 keV. Thus, implanted impurity functions as the so-called channel stop impurity (FIG. 4B).

After the resist is removed, the oxidation is conducted at 1000° C. in a wet atmosphere.

Figure 4C:
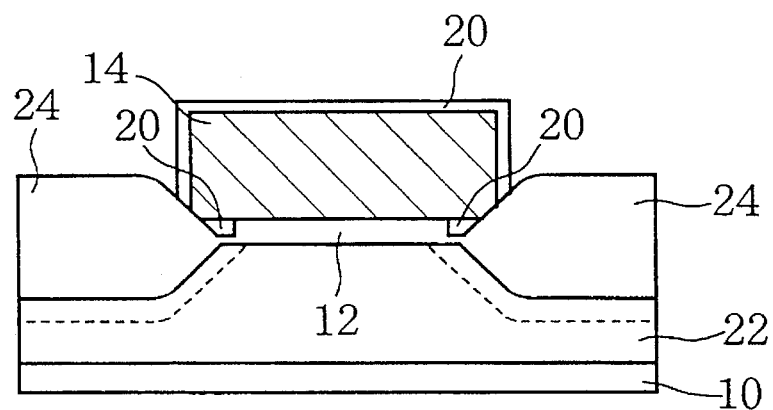

Thus the well and the device isolation film 24 are formed (FIG. 4C).

As shown in FIGS. 5A–5D and 6A–6C, the ion implanting step for forming the well, and the drive-in diffusion step may be conducted after the first silicon nitride film has been patterned.

Figure 5A:
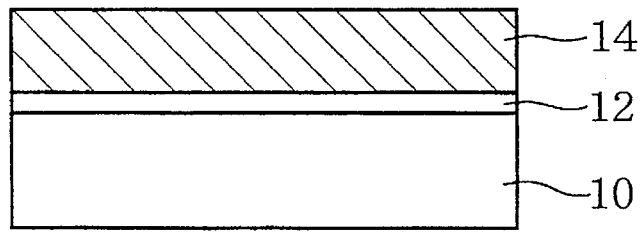
FIGS. 5A–5D and 6A–6C are sectional views of a semiconductor device in the steps of a second variation of the method for fabricating a semiconductor device according to the first embodiment of the present invention for explanation of the method.

To this end, a first (100)-oriented p-type silicon substrate 10 having a resistivity of about 10 Ω-cm is oxidized at 950° C. in a dry atmosphere to form the first oxide film 12 about 15 nm-thick. Then, the first silicon nitride film 14 about 100 nm-thick is deposited on the first oxide film 12 by low-pressure CVD (FIG. 5A).

Figure 5B:
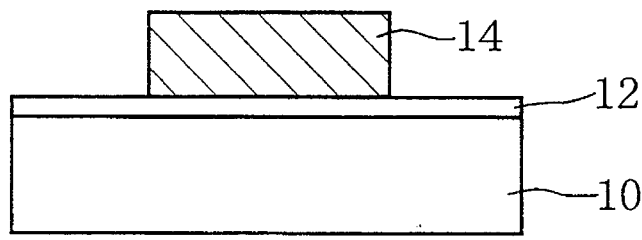

Then, the resist is patterned by lithography to remove that portion of the first silicon nitride film 14 that is in a region for the device isolation film to be formed in by RIE using $CHF_3$ gas (FIG. 5B).

Next, the resist is patterned by lithography, and ions are implanted in a region for the well to be formed in. When the region is for a p-well, a dose of about $1\times10^{13}$ B ions cm, for example, is implanted at 180 keV, and a dose of about $1\times10^{13}$ P ions $cm^{-2}$ for example, is implanted at 180 keV when the region is for an n-well.

Figure 5C:
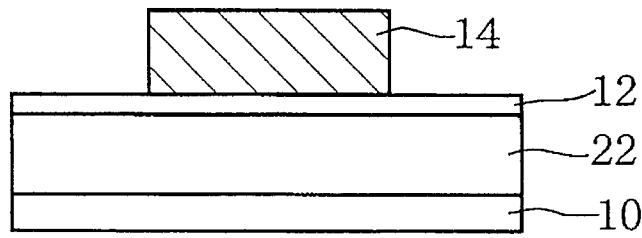
Figure 5D:
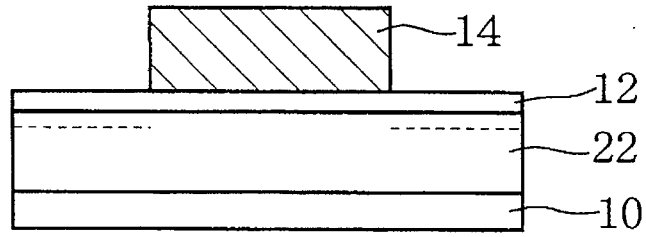

After the resist is removed, heat treatment is conducted at 1200° C. for 90 minutes in a nitrogen atmosphere to drive in the implanted impurity. Thus the well 22 is formed (FIG. 5C).

Then, the resist is patterned so that the formed p-well region is exposed. Ion implantation is conducted with the resist as a mask. A dose of about $4\times10^{13}$ B ions $cm^{-2}$, for example, is implanted at 20 keV. Thus, the implanted impurity functions as the so-called channel stop impurity (FIG. 5B).

Figure 6A:
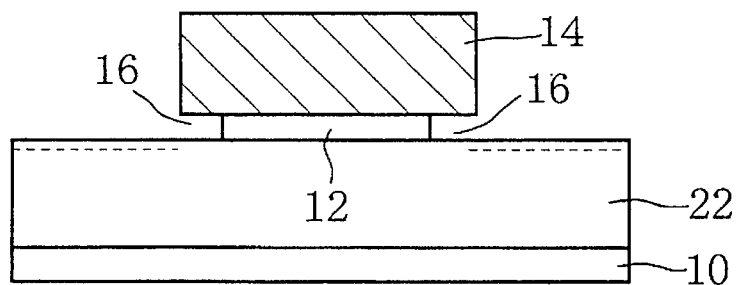

After the resist is removed, the first oxide film 12 is removed with the patterned first silicon nitride film 14 as a mask by wet etching using an aqueous solution of hydrogen fluoride. At this time the aqueous solution of hydrogen fluoride intrudes into the underside of the first silicon nitride film 14 to etch the first oxide film 12, and a side edge hollow 16 is formed (FIG. 6A).

Figure 6B:
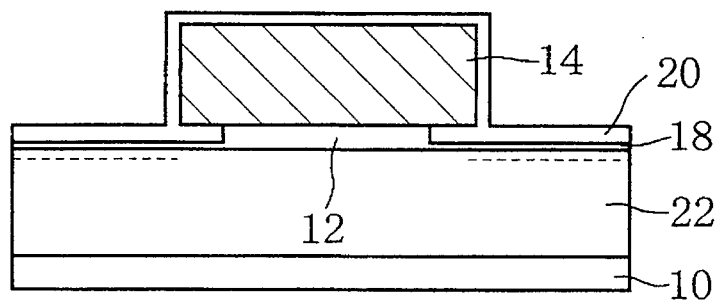

Then, oxidation is performed at 800° C. in a dry atmosphere to form the second oxide film 18 about 5 nm-thick. Subsequently the second silicon nitride film 20 about 10 nm-thick is deposited on the second oxide film 18 by low-pressure CVD. (FIG. 6B).

After the resist is removed, the oxidation is conducted at 1000° C. is a wet atmosphere.

Figure 6C:
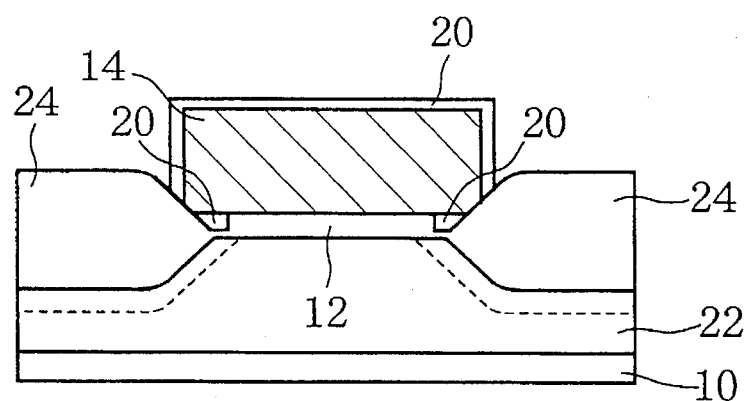

Thus the well and the device isolation film 24 are formed (FIG. 6C).

Next, the method for fabricating a semiconductor device according to a second embodiment of the present invention will be explained with reference to FIGS. 7 and 8.

FIGS. 7A–7D and 8A–8D are sectional views of a semiconductor device in the steps of the method for fabricating the semiconductor according to the second embodiment.

In the first embodiment, a silicon nitride film which is coarse and has low oxidation resistance is used as the second silicon nitride film, so that thickness disuniformity of the device isolation film is reduced. But in the method for fabricating a semiconductor device according to the present embodiment, a second silicon nitride film in a device isolation region is removed.

Figure 7A:
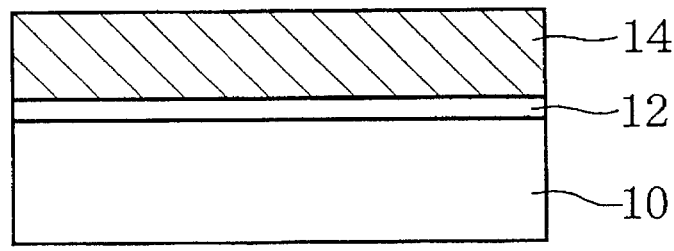
FIGS. 7A–7D and 8A–8D are sectional views of a semiconductor device in the steps of the method for fabricating a semiconductor device according to a second embodiment of the present invention for explanation of the method.

A (100)-oriented p-type silicon substrate 10 having a resistivity of about 10 $\Omega$-cm is oxidized at 950° C. in a dry atmosphere to form a first oxide film 12 about 15 nm-thick. Then, a first silicon nitride film 14 about 100 nm-thick is deposited on the first oxide film 12 by low-pressure CVD. A source gas is $SiH_2Cl_2$, and a substrate temperature is 725° C. (FIG. 7A).

Figure 7B:
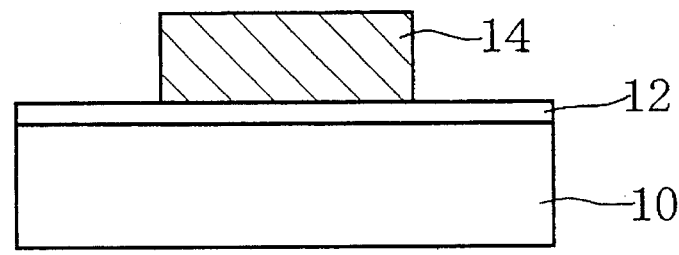

Then, a resist is patterned by lithography, and that portion of the first silicon nitride film 14 that is in a region for a device isolation film to be formed in is removed by RIE using $CHF_3$ gas. In the present embodiment, because the patterning for formation of the device isolation film is conducted before formation of a well, no global step is present on the surface of the silicon substrate 10, so that even semiconductor devices having miniaturized patterns are free from decreased DOFs (FIG. 7B).

Figure 7C:
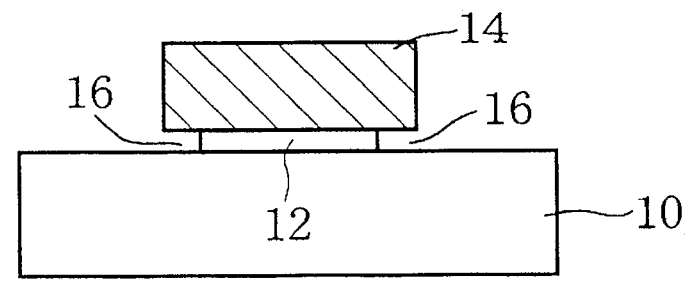

After the resist is removed, the first oxide film 12 is removed with the patterned first silicon nitride film 14 as mask by wet etching using an aqueous solution of hydrogen fluoride. At this time, the aqueous solution of hydrogen fluoride intrudes into the underside of the first nitride film and etches the first oxide film 12, and a side edge hollow 16 is formed (FIG. 7C).

Figure 7D:
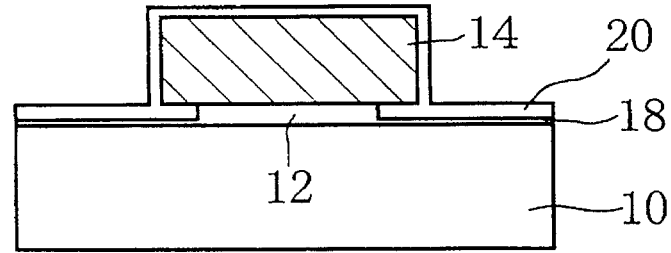

Next, oxidation is conducted at 800° C. in a dry atmosphere to form a second oxide film 18 about 5 nm-thick. Subsequently, a second silicon nitride film 20 about 10 nm-thick is deposited on the second oxide film 18 by low-pressure CVD. A source gas is $SiHCl_3$, and a substrate temperature is 775° C. (FIG. 7D).

Figure 8A:
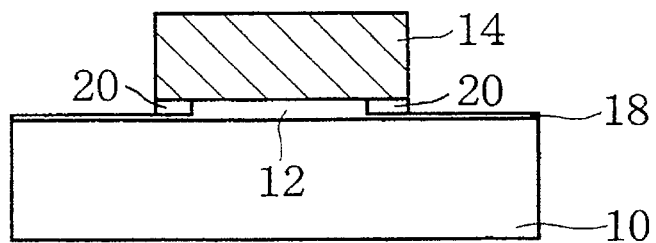

Then that portion of the second silicon nitride film 20 that is in a region for a device isolation film to be formed in is removed by wet etching using phosphoric acid or RIE using $CF_4$ gas. At this time the second silicon nitride film 20 remains in the side edge hollow 16, formed when the first oxide film was removed (FIG. 8A).

Then a resist is patterned by lithography, and ions are implanted in a region for a well to be formed in. When the well region is for a p-well, a dose of $1\times10^{13}$ B ions $cm^{-2}$, for example is implanted at 180 keV, and a dose of $1\times10^{13}$ P ions $cm^{-2}$, for example, is implanted when the region is for an n-well.

At this time, the impurity implanted in the device region is doped in the silicon substrate 10 through the first oxide film 12 and the first silicon nitride film 14. But concentration variation of the impurity doped in the silicon substrate through these insulating films can be reduced, thus reducing thickness disuniformity of the oxide film and the nitride film, because the first oxide film and the first silicon nitride film respectively are 15 nm-thick and 100 nm-thick, which are thinner than those formed by conventional NCL.

Figure 8B:
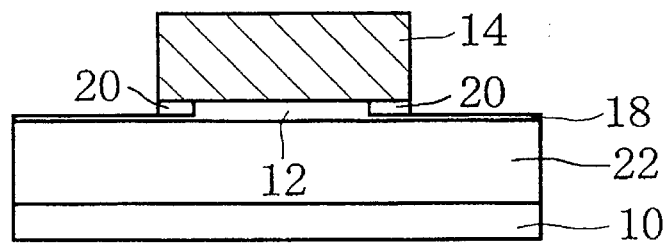

After the resist is removed, heat treatment is conducted at 1200° C. for 90 minutes in a nitrogen atmosphere. The implanted impurity is driven in. And a well 22 is formed (FIG. 8B).

Figure 8C:
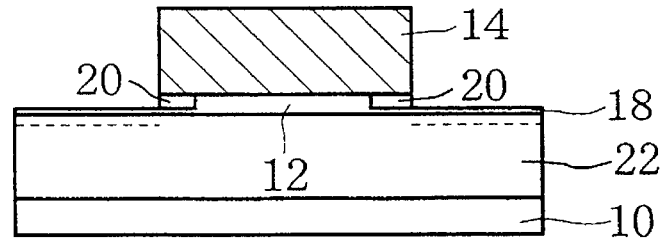

Subsequently, a resist is patterned so that the formed p-well region is exposed, and ion implantation is conducted with the resist as a mask. A dose of about $4\times10^{13}$ B ions $cm^{-2}$, for example, is implanted at 20 keV. The impurity doped by this ion implantation is the so-called channel stop impurity (FIG. 8C).

Figure 8D:
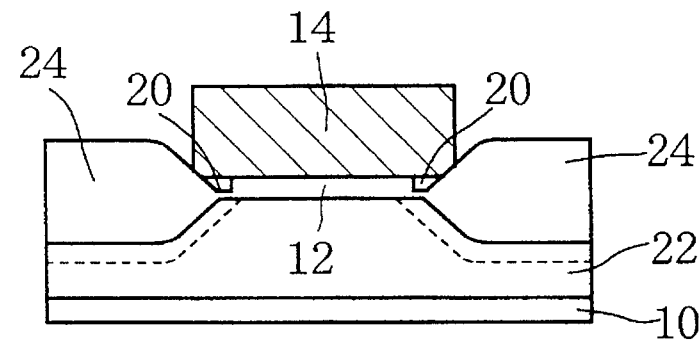
Figure 9A:
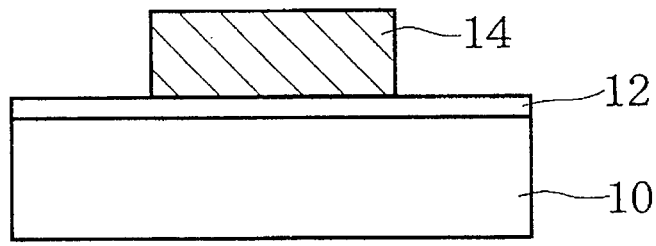
FIGS. 9A–9D are sectional views of a semiconductor device in the steps of a conventional method for forming a device isolation film.
Figure 9B:
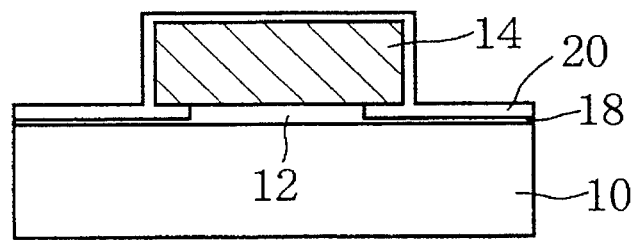
Figure 9C:
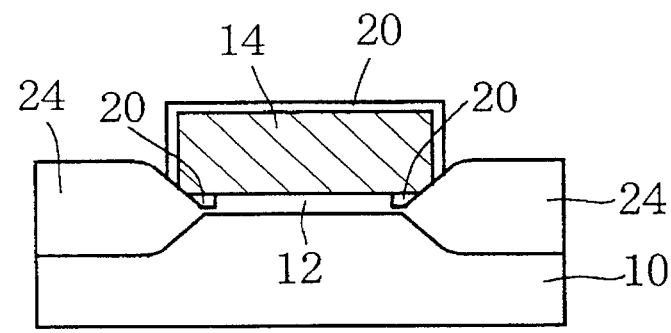
Figure 9D:
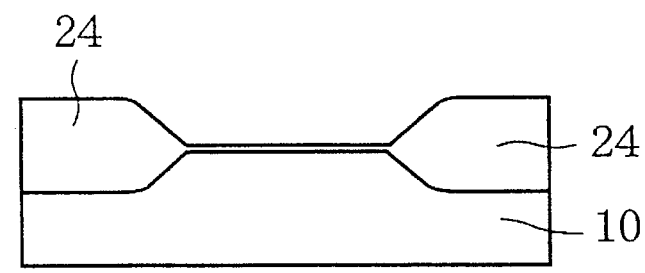
Figure 10A:
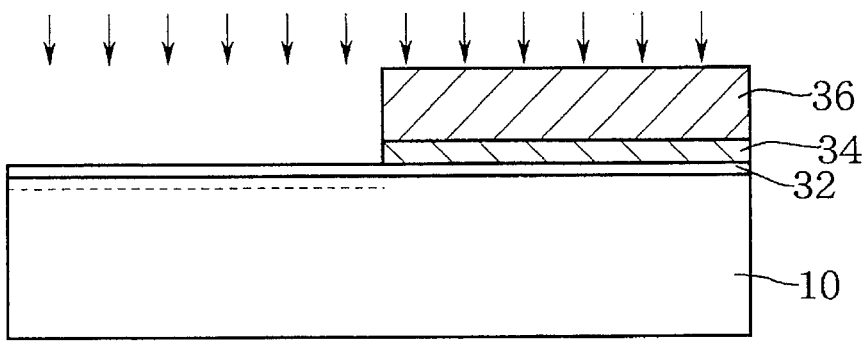
FIGS. 10A–10D are sectional views of self-aligned twin wells in the steps of a conventional self-aligned twin well forming method for explanation of the method.
Figure 10B:
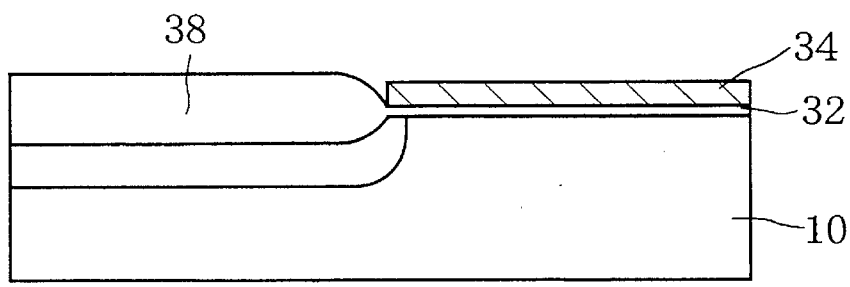
Figure 10C:
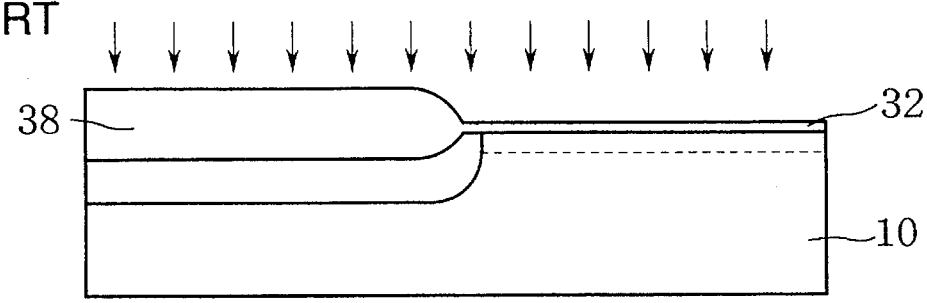
Figure 10D:
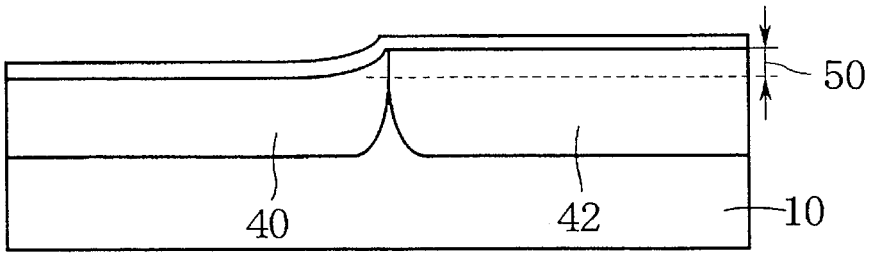
Figure 11A:
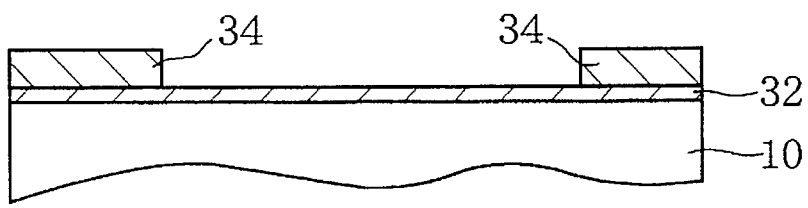
FIGS. 11A–11D are sectional views of twin wells in the steps of another conventional twin wells forming method for explanation of the method.
Figure 11B:
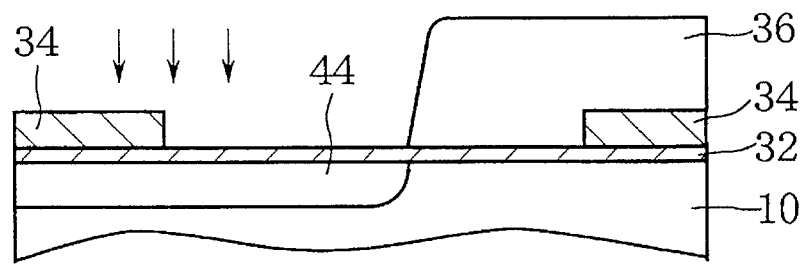
Figure 11C:
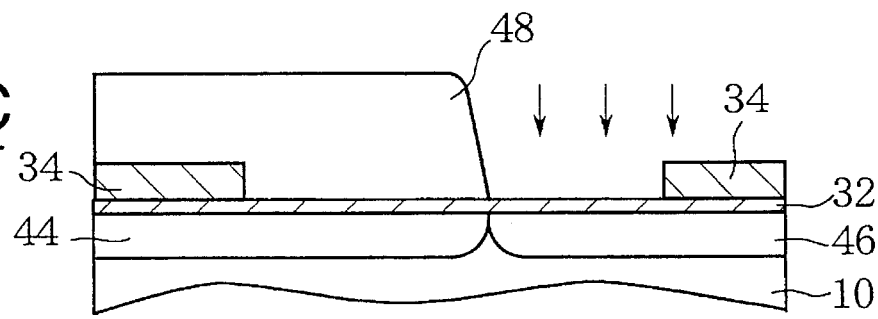
Figure 11D:
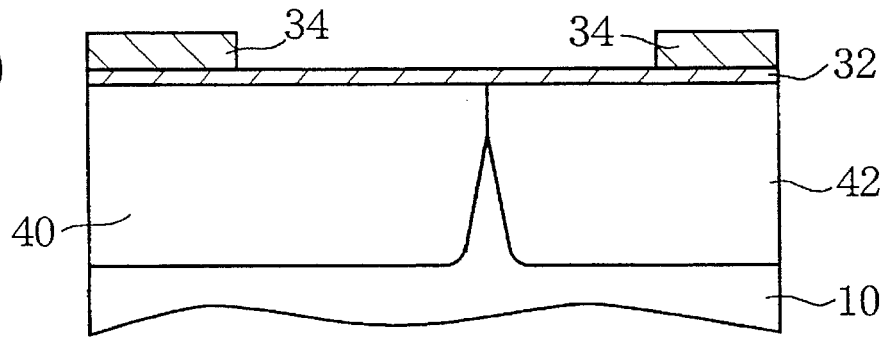

After the resist is removed, oxidation is conducted at 1000° C. in a wet atmosphere. At this time, different from the first embodiment, the second silicon nitride film 20 is absent, in the device isolation region, and the first silicon nitride film 14 is present in the device region. This enables the device isolation film 24 to be selectively grown with the first silicon nitride film as an oxidation mask (FIG. 8D). In forming the device isolation film 24 by conventional NCL, because of the second silicon nitride film 20 covering the second silicon oxide film 18, thickness disuniformity of the second silicon nitride film 20 generated in formation thereof affects the thickness of the device isolation film 24. But the present embodiment, in which none of the second silicon nitride film 20 is present in the device isolation region, can reduce thickness disuniformity of the device isolation film 24 better than the conventional NCL.

That portion of the second silicon nitride film 20 that filled in the side edge hollow 16 reduces an oxidation rate of the side edge hollow 16, whereby the above-described effects can be produced with a sharp bird's beak profile being retained.

Thus, in the present embodiment, in which the second silicon nitride film is deposited, and then that portion of the second silicon nitride film that is in the device isolation film region is etched off, when the device isolation film is formed, the oxidation can be homogeneous, and is not influenced by the second silicon nitride film.

In the present embodiment, as the second silicon nitride film 20, a nitride film which is more liable to oxidation than the first silicon nitride film is deposited, but that portion of the second silicon nitride film 20 that is in the region for the device isolation film to be formed in is later removed. Accordingly, the method for fabricating a semiconductor device according to the present embodiment has no limitation to the quality of the silicon nitride film.

What is claimed is:

1. A method for fabricating a semiconductor device comprising the steps of:

forming a first oxide film on a surface of a semiconductor substrate and forming a first nitride film on a surface of the first oxide film, the first nitride film having a predetermined pattern;

isotropically etching the first oxide film, with the first nitride film as a mask, to partially expose the surface of the semiconductor substrate and form a hollow just under an end portion of the first nitride film;

forming a second oxide film, thinner than the first oxide film, at least on the surface of the semiconductor substrate exposed at the outside of the first nitride film and on a inner surface of the hollow;

depositing a second silicon nitride film on at least the second oxide film, the second silicon nitride film being more liable to oxidation than the first silicon nitride film; and oxidizing a region where the first silicon nitride film is absent, with the first silicon nitride film as a mask, to form a device isolation film.

2. A method for fabricating a semiconductor device comprising the steps of:

forming a first oxide film on a surface of a semiconductor substrate and forming a first nitride film on a surface of the first oxide film, the first nitride film having a predetermined pattern;

isotropically etching the first oxide film, with the first nitride film as a mask, to partially expose the surface of the semiconductor substrate and form a hollow just under an end portion of the first nitride film;

forming a second oxide film, thinner than the first oxide film, at least on the surface of the semiconductor substrate exposed at the outside of the first nitride film and on a inner surface of the hollow;

depositing a second silicon nitride film on at least the second oxide film;

removing that portion of the second silicon nitride film that is deposited on a region for a device isolation film to be formed in; and oxidizing a region where the first silicon nitride film is absent, with the first silicon nitride film as a mask, to form the device isolation film.

3. A method for fabricating a semiconductor device according to claim 1, wherein the first oxide film has a film thickness of below about 20 nm; and the first silicon nitride film has a film thickness of below about 130 nm.

4. A method for fabricating a semiconductor device according to claim 2, wherein the first oxide film has a film thickness of below about 20 nm; and the first silicon nitride film has a film thickness of below about 130 nm.

5. A method for fabricating a semiconductor device according to claim 1, wherein the first silicon nitride film is deposited by chemical vapor deposition using $SiH_2Cl_2$ gas as a silicon source; and, the second silicon nitride film is deposited by chemical vapor deposition using $SiHCl_3$ gas as a silicon source.

6. A method for fabricating a semiconductor device according to claim 1, wherein the second silicon nitride film is deposited at a higher temperature than a temperature for the deposition of the first silicon nitride film.

7. A method for fabricating a semiconductor device according to claim 6, wherein the first silicon nitride film is deposited at a film forming temperature lower than 750° C.; and the second silicon nitride film is deposited at a film forming temperature higher than 750° C.

8. A method for fabricating a semiconductor device according to claim 1, wherein the device isolation film is formed by thermal oxidation at a temperature above 950° C.

9. A method for fabricating a semiconductor device according to claim 2, wherein the device isolation film is formed by thermal oxidation at a temperature above 950° C.

10. A method for fabricating a semiconductor device according to claim 3, wherein the device isolation film is formed by thermal oxidation at a temperature above 950° C.

11. A method for fabricating a semiconductor device according to claim 4, wherein the device isolation film is formed by thermal oxidation at a temperature above 950° C.

12. A method for fabricating a semiconductor device according to claim 5, wherein the device isolation film is formed by thermal oxidation at a temperature above 950° C.

13. A method for fabricating a semiconductor device according to claim 6, wherein the device isolation film is formed by thermal oxidation at a temperature above 950° C.

14. A method for fabricating a semiconductor device according to claim 1, wherein the step of forming the device isolation film includes a rapid thermal oxidation which can occur at a high temperature and in a short period of time.

15. A method for fabricating a semiconductor device according to claim 2, wherein the step of forming the device isolation film includes a rapid thermal oxidation which can occur at a high temperature and in a short period of time.

16. A method for fabricating a semiconductor device according to claim 3, wherein the step of forming the device isolation film includes a rapid thermal oxidation which can occur at a high temperature and in a short period of time.

17. A method for fabricating a semiconductor device according to claim 4, wherein the step of forming the device isolation film includes a rapid thermal oxidation which can occur at a high temperature and in a short period of time.

18. A method for fabricating a semiconductor device according to claim 5, wherein the step of forming the device isolation film includes a rapid thermal oxidation which can occur at a high temperature and in a short period of time.

19. A method for fabricating a semiconductor device according to claim 6, wherein the step of forming the device isolation film includes a rapid thermal oxidation which can occur at a high temperature and in a short period of time.

* * * * *